(12) United States Patent
Ng

(10) Patent No.: US 11,177,806 B2
(45) Date of Patent: Nov. 16, 2021

(54) TECHNIQUES FOR REDUCING THE EFFECTS OF AGING IN LOGIC CIRCUITS

(71) Applicant: Intel Corporation, Santa Clara, CA (US)

(72) Inventor: Hoong Chin Ng, Gelugor (MY)

(73) Assignee: Intel Corporation, Santa Clara, CA (US)

( * ) Notice: Subject to any disclaimer, the term of this patent is extended or adjusted under 35 U.S.C. 154(b) by 631 days.

(21) Appl. No.: 16/018,762

(22) Filed: Jun. 26, 2018

(65) Prior Publication Data

US 2019/0044513 A1    Feb. 7, 2019

(51) Int. Cl.
*H03K 19/003* (2006.01)
*H03K 19/00* (2006.01)
*H03K 5/13* (2014.01)
*H03K 5/00* (2006.01)

(52) U.S. Cl.
CPC ........ *H03K 19/00315* (2013.01); *H03K 5/13* (2013.01); *H03K 19/0027* (2013.01); *H03K 2005/00241* (2013.01)

(58) Field of Classification Search
CPC ............... H03K 5/13; H03K 19/0027; H03K 19/00315; H03K 2005/00241
See application file for complete search history.

(56) References Cited

U.S. PATENT DOCUMENTS

| 9,966,126 B2 | 5/2018 | Ahn et al. |
| 2009/0319202 A1 | 12/2009 | Gebara et al. |
| 2014/0176116 A1* | 6/2014 | Kumar ............... H03K 3/0315 324/76.41 |

* cited by examiner

*Primary Examiner* — Kurtis R Bahr
(74) *Attorney, Agent, or Firm* — InventIQ Legal LLP

(57) ABSTRACT

Logic circuitry includes a first logic circuit, second logic circuits, a third logic circuit, and fourth logic circuits. The first logic circuit inverts a first output signal relative to an input signal only in response to a first control signal having a first state that indicates that the input signal has remained in a same logic state for at least a predefined period of time. The second logic circuits are coupled in series. The second logic circuits generate a second output signal in response to the first output signal. The third logic circuit inverts a third output signal relative to the second output signal only in response to the first control signal having the first state. The fourth logic circuits are coupled in series. The fourth logic circuits generate a fourth output signal in response to the third output signal.

20 Claims, 6 Drawing Sheets

TECHNIQUES FOR REDUCING THE EFFECTS OF AGING IN LOGIC CIRCUITS

FIELD OF THE DISCLOSURE

The present disclosure relates to electronic circuitry, and more particularly, to techniques for reducing the effects of aging in logic circuits.

BACKGROUND

As metal oxide semiconductor field-effect transistors (MOSFETs) in logic circuits age, the performance of the transistors degrades over time. One mechanism that contributes to this degradation is negative bias temperature instability (NBTI). NBTI is particularly problematic in p-channel MOSFETs (PMOSFETs), because PMOSFETs almost always operate with a negative gate-to-source voltage.

NBTI may cause an increase in the absolute threshold voltage of a transistor and a degradation of the mobility, drain current, and transconductance of the transistor. Aging in transistors within logic circuits that is caused by NBTI can impact the duty cycle and pulse width of a logic signal passing through the logic circuits after the logic signal has been inactive for an extended time.

Power gating has been used to power off logic circuits that are inactive in a signal path to reduce aging caused by NBTI. NBTI aging does not occur in the logic circuits that are powered off. However, power gating requires handshaking at the interface between the power gated logic circuits and the logic circuits that are not power gated. Also, power gating typically requires a relatively long time to power on and power off the logic circuits. Therefore, power gating is not usable in applications with low signal activity and that are always on.

Periodic toggling has been used to toggle signals at a low frequency in logic circuits that are inactive. This approach causes even NBTI aging in all the logic circuits that are periodically toggled. However, periodic toggling at low frequency disturbs the logic state of the output signal of the logic circuits, which impacts all downstream circuits. Therefore, periodic toggling is not usable in applications with low signal activity and that are always on.

DETAILED DESCRIPTION

Many integrated circuits have signal paths that include a series of logic circuits. As an example, several complementary metal oxide semiconductor (CMOS) inverters may be coupled in series and used as a delay chain. If a series of inverting CMOS logic circuits are inactive for an extended period of time, only the logic circuits in which the p-channel metal oxide semiconductor field-effect transistors (MOSFETs) are on are exposed to significant aging caused by NBTI. The logic circuits in which the n-channel MOSFETs are on are not typically exposed to significant NBTI aging.

Because only the p-channel MOSFETs in a series of inverting logic circuits are exposed to significant aging caused by NBTI, the pulse width and duty cycle of the output signal of the logic circuits change over time. As an example, if the input signal to an even number of inverting CMOS logic circuits is a logic high for an extended time, only the even numbered logic circuits in the series are exposed to NBTI aging, which causes the pulse width and duty cycle of the output signal of the logic circuits to decrease. On the other hand, if the input signal to an even number of inverting CMOS logic circuits is a logic low for an extended time, only the odd numbered logic circuits in the series are exposed to NBTI aging, which causes the pulse width and duty cycle of the output signal of the logic circuits to increase. The shifts in pulse width and duty cycle of the output signal are proportional to the number of logic circuits. Thus, if many inverting logic circuits are coupled in series, the pulse width and duty cycle of the output signal may shift substantially. Circuits that are greatly affected by this effect include input/output buffer circuits and clock networks.

According to some embodiments disclosed herein, variations in the pulse width and duty cycle of an output signal of a series of logic circuits that are caused by NBTI aging are reduced by adding extra logic inversions into the signal path when the logic circuits are inactive. In some embodiments, two XOR logic gate circuits or two multiplexer circuits and two extra inverter circuits are coupled into the signal path through the logic circuits in order to trigger two extra logic inversions in the signal path. The techniques disclosed herein can reduce or eliminate the variations in the pulse width and duty cycle of the output signal of a series of logic circuits, while retaining the logic state of the output signal. The techniques disclosed herein may be used in applications with low signal activity and that are always on.

Figure 1:
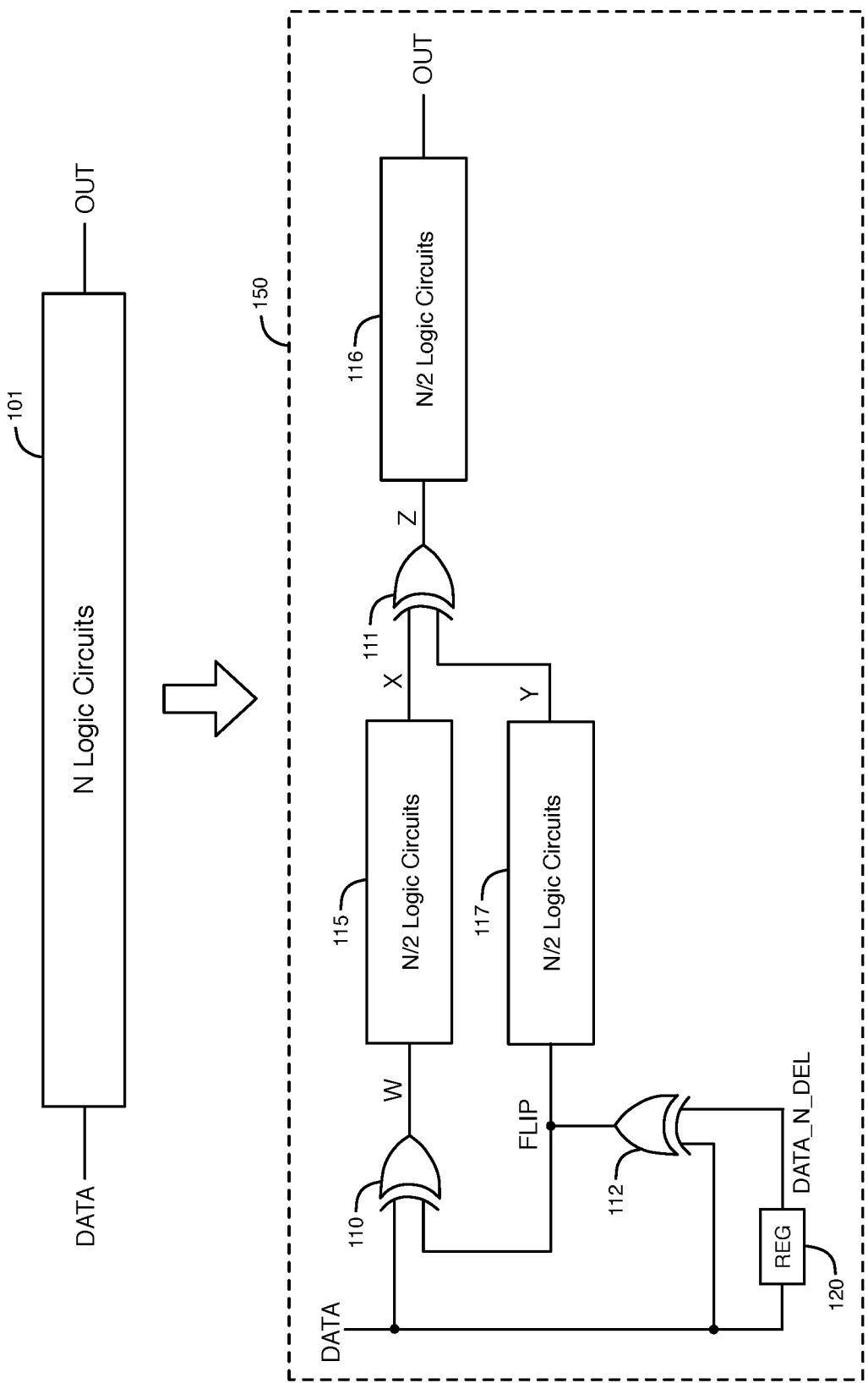
FIG. 1 illustrates an example of circuitry that can be used to reduce the effects of NBTI aging on the pulse width and duty cycle of a signal generated by a series of inverting CMOS logic circuits, according to an embodiment.

FIG. 1 illustrates an example of circuitry that can be used to reduce the effects of NBTI aging on the pulse width and duty cycle of a signal generated by a series of inverting CMOS logic circuits, according to an embodiment. Figure (FIG. 1 illustrates an N number of CMOS logic circuits 101 that are coupled in series. Each of the logic circuits 101 is inverting. In the embodiment of FIG. 1, N is an even number greater than 1. Logic circuits 101 receive an input data signal DATA and generate an output data signal OUT based on the input signal DATA. NBTI aging may cause variations in the duty cycle and pulse width of output signal OUT if logic circuits 101 are inactive for an extended time period. NBTI aging mainly impacts the p-channel MOSFETs in logic circuits 101, as discussed above.

According to an embodiment, logic circuits 101 are replaced with logic circuitry 150. In logic circuitry 150, logic circuits 101 are divided into two equal sets 115 and 116. Each of the two sets of logic circuits 115 and 116 has half the number of logic circuits as logic circuits 101. Thus, each set of logic circuits 115 and 116 has an N/2 number of logic circuits.

In addition, logic circuitry 150 includes XOR logic gate circuits 110-112, logic circuits 117, and register circuit 120. The set of logic circuits 117 has substantially the same delay as logic circuits 115. Logic circuits 117 may be a duplicate copy of logic circuits 115, such that logic circuits 117 have an N/2 number of CMOS inverting logic circuits. In some embodiments, each logic circuit in each set of logic circuits 115-117 is the same type of logic circuit having the same circuit architecture.

The input signal DATA is provided to inputs of XOR gate circuits 110 and 112 and to an input of register circuit 120. Register circuit 120 includes one or more flip-flop circuits. Register circuit 120 delays and inverts input signal DATA by one or more unit intervals to generate a delayed data signal DATA_N_DEL. Each of the unit intervals corresponds to the period of one digital bit in input signal DATA. The delayed data signal DATA_N_DEL is provided to a second input of XOR gate circuit 112. XOR gate circuit 112 performs an XOR Boolean function on the bits received in signals DATA and DATA_N_DEL to generate bits in a control signal FLIP. Signal FLIP is provided to a second input of XOR gate circuit 110 and to the input of logic circuits 117. XOR gate circuit 110 performs an XOR Boolean function on the bits received in signals DATA and FLIP to generate bits in a signal W that is provided to the input of logic circuits 115.

Logic circuits 115 generate an output signal X at a first input of XOR gate circuit 111 based on signal W (e.g., by delaying signal W). Logic circuits 117 delay signal FLIP to generate a delayed control signal Y at a second input of XOR gate circuit 111. Ideally, the delay of logic circuits 117 is the same or substantially the same as the delay of logic circuits 115 to prevent a glitch in the Y signal when the FLIP signal toggles. XOR gate circuit 111 performs an XOR Boolean function on the bits received in signals X and Y to generate bits in an output signal Z. Logic circuits 116 generate an output signal OUT based on signal Z (e.g., by delaying signal Z).

Figure 2:
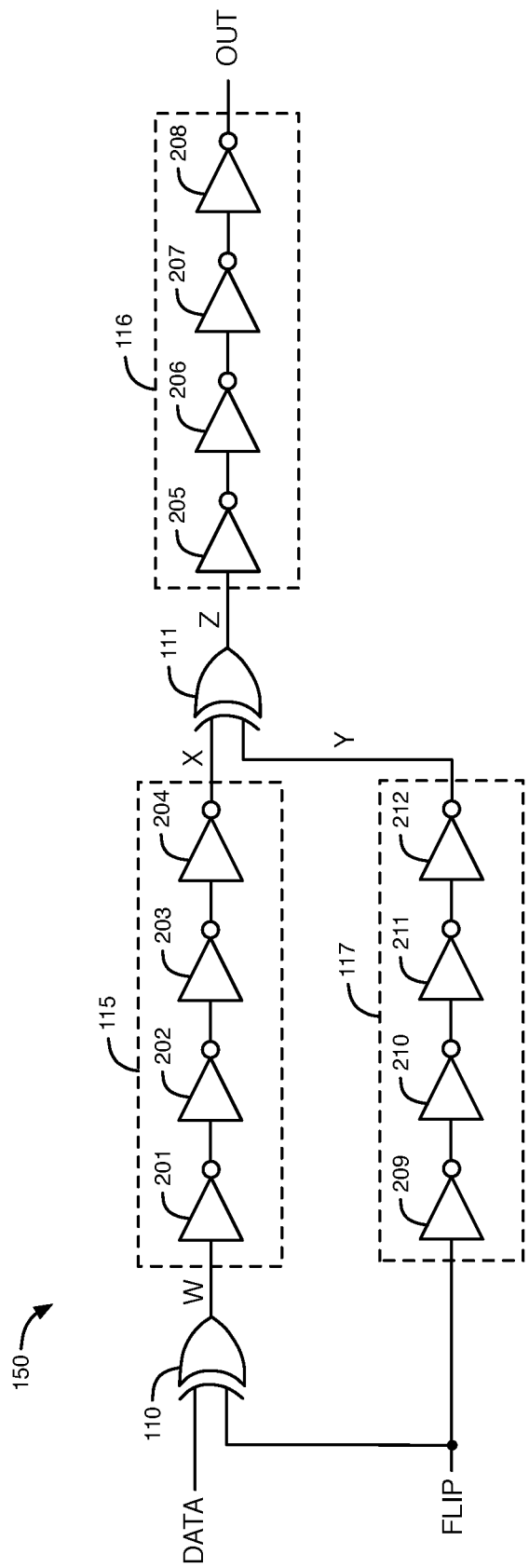
FIG. 2 illustrates further details of an example of the circuitry of FIG. 1, according to an embodiment.

FIG. 2 illustrates further details of circuitry 150, according to an embodiment. In the exemplary embodiment of FIG. 2, each of the three sets of logic circuits 115, 116, and 117 has 4 inverting CMOS logic gate circuits. Logic circuits 115 have 4 inverting logic gate circuits 201-204. Logic circuits 116 have 4 inverting logic gate circuits 205-208. Logic circuits 117 have 4 inverting logic gate circuits 209-212. Although each set of logic circuits 115-117 has 4 inverting logic gate circuits in the embodiment of FIG. 2, it should be understood that embodiments of the present invention can have any number of logic circuits in each set of the logic circuits 115-117.

Logic gate circuits 201-212 may be any type of CMOS logic circuits. In some embodiments, each of the logic gate circuits may be the same type of logic gate circuit having the same circuit architecture. As an example, each of the logic gate circuits 201-212 may be a CMOS inverter circuit. As another example, each of the logic gate circuits 201-212 may be a NAND logic gate circuit having a second input (not shown) coupled to receive another signal.

Figure 3:
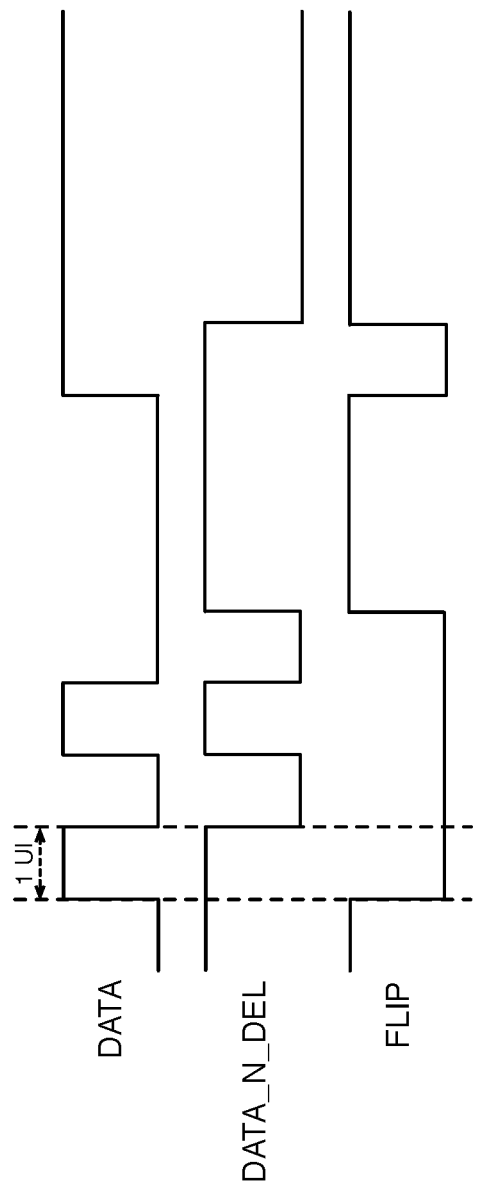
FIG. 3 is a timing diagram that shows examples of waveforms for three of the signals shown in FIG. 1, according to an embodiment.

FIG. 3 is a timing diagram that shows examples of waveforms for three of the signals shown in FIG. 1, according to an embodiment. Further details of the operation of the circuitry 150 shown in FIGS. 1-2 will now be described with respect to the timing diagram of FIG. 3. In the embodiment of FIG. 3, register circuit 120 inverts and delays the data indicated by input signal DATA by one unit interval (UI) to generate the delayed data signal DATA_N_DEL. Thus, register circuit 120 generates the first falling edge in signal DATA_N_DEL shown in FIG. 3 in response to the first rising edge in signal DATA shown in FIG. 3. However, it should be understood that in other embodiments, register circuit 120 may invert and delay the data indicated by the DATA signal by 2, 3, 4, or more unit intervals to generate the delayed signal DATA_N_DEL. FIG. 3 also shows the period of one UI.

XOR gate 112 generates the FLIP signal by performing an XOR function on the logic states of signals DATA and DATA_N_DEL, as discussed above with respect to FIG. 1. Because the DATA_N_DEL signal is inverted and delayed by 1 UI relative to the DATA signal, the DATA and DATA_N_DEL signals have the same logic state when the DATA signal is toggling in each unit interval (UI) as shown for example in FIG. 3. XOR gate circuit 112 generates a logic low state in the FLIP signal in response to the DATA and DATA_N_DEL signals having the same logic state as shown for example in FIG. 3.

In the following discussion, it is assumed that each of the three sets of logic circuits 115-117 has an even number of inverting logic circuits (i.e., N/2 is an even number) as an illustrative example. If logic circuits 117 have an even number of inverting logic circuits, as shown for example in FIG. 2, logic circuits 117 cause signal Y to have the same logic state as signal FLIP after the delay of logic circuits 117. Each falling and rising edge in signal FLIP propagates through logic circuits 117 to generate a corresponding falling or rising edge, respectively, in signal Y. Thus, a logic low state in the FLIP signal propagates through logic circuits 117 to signal Y.

When the DATA signal is toggling in each UI, the logic circuits 115-116 are active, and therefore, logic circuits 115-116 do not experience aging caused by NBTI. As discussed above, the FLIP signal is in a logic low state in response to the DATA signal toggling in each unit interval (UI). In response to the FLIP signal being in a logic low state, XOR gate circuit 110 functions as a buffer circuit that causes signal W to have the same logic state as the DATA signal. In this example, logic circuits 115 have an even number of inverting logic gate circuits, and as a result, logic circuits 115 cause signal X to have the same logic state as signal W after the delay of logic circuits 115. Thus, each falling and rising edge in signal W propagates through logic circuits 115 to generate a corresponding falling or rising edge, respectively, in signal X.

When signal Y is in a logic low state in response to the FLIP signal being in a logic low state, XOR gate circuit 111 also functions as a buffer circuit that causes signal Z to have the same logic state as signal X. Because logic circuits 116 also have an even number of inverting logic gate circuits in this example, logic circuits 116 cause signal OUT to have the same logic state as signal Z after the delay of logic circuits 116. Thus, in response to the FLIP signal being in a logic low state, both of XOR gate circuits 110 and 111 function as buffer circuits that allow the logic state of signal DATA to propagate to signal OUT without any extra logic inversions, other than the logic inversions added by the logic gate circuits (e.g., logic gates 201-208) in logic circuits 115-116.

As discussed above, the p-channel MOSFETs in circuitry 150 that are on may experience the effects of aging caused by NBTI when the DATA signal is parked in the same logic state for an extended period of time. The XOR gates 110-112, logic circuits 117, register 120, and the FLIP, DATA_N_DEL, and Y signals in circuitry 150 mitigate the adverse effects of aging caused by NBTI, as discussed below.

As mentioned above, the DATA_N_DEL signal is inverted and delayed by 1 UI relative to the DATA signal.

When the logic state of the DATA signal remains the same for more than one UI in the embodiment of FIG. 3, the DATA and DATA_N_DEL signals have opposite logic states. In other embodiments, the DATA and DATA_N_DEL signals have opposite logic states when the logic state of the DATA signal remains the same for more than at least 2, 3, 4, or more unit intervals, depending on the delay of register circuit 120. XOR gate 112 generates a logic high state in the FLIP signal in response to the DATA and DATA_N_DEL signals having opposite logic states as shown for example in FIG. 3.

In response to the FLIP signal being in a logic high state, XOR gate circuit 110 functions as an inverter circuit that causes signal W to have the opposite logic state as the DATA signal. In this example, the logic state of signal W propagates through logic circuits 115 to signal X, and the logic high state in the FLIP signal propagates through logic circuits 117 to signal Y. In response to signal Y being in a logic high state, XOR gate circuit 111 also functions as an inverter circuit that causes signal Z to have the opposite logic state as signal X. In this example, the logic state of signal Z propagates through logic circuits 116 to signal OUT. Each of the three sets of logic circuits 115-117 is non-inverting in this example.

Thus, in response to the FLIP and Y signals being in logic high states, both of XOR gate circuits 110 and 111 function as inverter circuits that cause the logic state of signal DATA to propagate to signal OUT with two extra inversions. As a result, signal OUT has the same logic state as signal DATA after the delay of circuitry 150 when the FLIP signal is in a logic high state. As discussed above, the FLIP signal is in a logic high state in response to the logic state of the DATA signal remaining the same for more than one UI in this example. When the logic state of the DATA signal remains the same for more than one UI, circuitry 150 causes XOR gate circuits 110-111 to add two extra logic inversions into the signal path from DATA to OUT to reduce the effects of NBTI aging that may occur if logic circuits 115-116 are inactive for an extended period of time. The two extra logic inversions added by XOR gate circuits 110-111 cause the input signal W to logic circuits 115 to be in the opposite logic state as the input signal Z to logic circuits 116. As a result, logic circuits 115 experience the effects of NBTI aging in the opposite order relative to logic circuits 116.

As an illustrative example, if the DATA signal is parked in a logic low state for more than a predefined time period (e.g., more than one unit interval), the FLIP, W, X, and Y signals are all in logic high states, and the Z signal is in a logic low state. Thus, the W and Z signals are in opposite logic states while the DATA signal is parked in a logic low state for more than the predefined time period. In response to signal W being in a logic high state, the even numbered logic gate circuits (e.g., logic gates 202 and 204) in logic circuits 115 are exposed to significant NBTI aging, and the odd numbered logic gate circuits (e.g., logic gate circuits 201 and 203) in logic circuits 115 are not exposed to significant NBTI aging. The even numbered logic gate circuits are exposed to significant NBTI aging, because the p-channel MOSFETs in these logic gates are on generating logic high output signals. The odd numbered logic gate circuits are not exposed to significant NBTI aging, because the p-channel MOSFETs in these logic gates are off. In response to signal Z being in a logic low state, the odd numbered logic gates (e.g., logic gates 205 and 207) in logic circuits 116 are exposed to significant NBTI aging, and the even numbered logic gate circuits (e.g., logic gates 206 and 208) in logic circuits 116 are not exposed to significant NBTI aging for the same reasons.

As another illustrative example, if the DATA signal is parked in a logic high state for more than a predefined time period (e.g., more than one unit interval), the FLIP and Y signals are in logic high states, the W and X signals are in logic low states, and the Z signal is in a logic high state. Thus, the W and Z signals are in opposite logic states while the DATA signal is parked in a logic high state for more than the predefined time period. In response to signal W being in a logic low state, the odd numbered logic gate circuits (e.g., logic gates 201 and 203) in logic circuits 115 are exposed to significant NBTI aging, and the even numbered logic gate circuits (e.g., logic gate circuits 202 and 204) in logic circuits 115 are not exposed to significant NBTI aging. In response to signal Z being in a logic high state, the even numbered logic gate circuits (e.g., logic gates 206 and 208) in logic circuits 116 are exposed to significant NBTI aging, and the odd numbered logic gate circuits (e.g., logic gates 205 and 207) in logic circuits 116 are not exposed to significant NBTI aging.

Thus, if the DATA signal is parked in the same logic state for an extended period of time, logic circuits 115 experience significant NBTI aging in the opposite order than logic circuits 116 (i.e., even numbered versus odd numbered). As a result, the change in the pulse width and duty cycle of the signal propagating through logic circuits 116 cancels out the change in the pulse width and duty cycle of the signal propagating through logic circuits 115 when the DATA signal is toggling.

As an example, the effects of NBTI aging that occur when the DATA signal is parked in a logic low state for an extended time may cause the even numbered logic circuits 115 to decrease the pulse width and duty cycle of signal X and the odd numbered logic circuits 116 to increase the pulse width and duty cycle of signal OUT relative to signal Z. NBTI aging increases the absolute values of the threshold voltages of the p-channel MOSFETs in logic gates 202, 204, 205, and 207, which increases the durations of the rising edges of the output signals of these logic gates. Rising edges in the output signals of logic gates 205 and 207 propagate through logic circuits 116 to become falling edges in signal OUT, and rising edges in the output signals of logic gates 202 and 204 propagate through logic circuits 115-116 to become rising edges in signal OUT when signal Y is low. As a result, when the DATA signal is toggling, and the FLIP and Y signals are low, the decrease in the pulse width of signal X caused by the even numbered logic circuits 115 (e.g., 202 and 204) cancels out the increase in the pulse width of signal OUT relative to signal Z caused by the odd numbered logic circuits 116 (e.g., 205 and 207). Therefore, the pulse width and duty cycle of signal OUT remain the same or substantially the same after the effects of NBTI aging have occurred in logic circuits 115-116 as a result of signal DATA being parked low.

As another example, the effects of NBTI aging that occur when the DATA signal is parked in a logic high state for an extended time may cause the odd numbered logic circuits 115 to increase the pulse width and duty cycle of signal X and the even numbered logic circuits 116 to decrease the pulse width and duty cycle of signal OUT relative to signal Z. NBTI aging increases the absolute values of the threshold voltages of the p-channel MOSFETs in logic gates 201, 203, 206, and 208, which increases the durations of the rising edges of the output signals of these logic gates. When the DATA signal is toggling, rising edges in the output signals of logic gates 201 and 203 propagate through logic circuits 115-116 to become falling edges in signal OUT, and rising edges in the output signals of logic gates 206 and 208 propagate through logic circuits 116 to become rising edges in signal OUT. As a result, when the DATA signal is toggling, and the FLIP and Y signals are low, the increase in the pulse width of signal X caused by the odd numbered logic circuits 115 (e.g., 201 and 203) cancels out the decrease in the pulse width of signal OUT relative to signal Z caused by the even numbered logic circuits 116 (e.g., 206 and 208). Therefore, the pulse width and duty cycle of signal OUT remain the same or substantially the same after the effects of NBTI aging have occurred in logic circuits 115-116 as a result of signal DATA being parked high.

Circuitry 150 causes the logic state of signal DATA to propagate to signal OUT through XOR gate 110, logic circuits 115, XOR gate 111, and logic gates 116 when the FLIP signal is in a logic high state or in a logic low state. Thus, the logic state of the DATA signal propagates to signal OUT regardless of whether the DATA signal is toggling or parked in the same logic state for more than one UI. As a result, circuitry 150 does not cause changes to the logic operation of the logic circuitry (not shown) that is coupled to its output at signal OUT.

Figure 4:
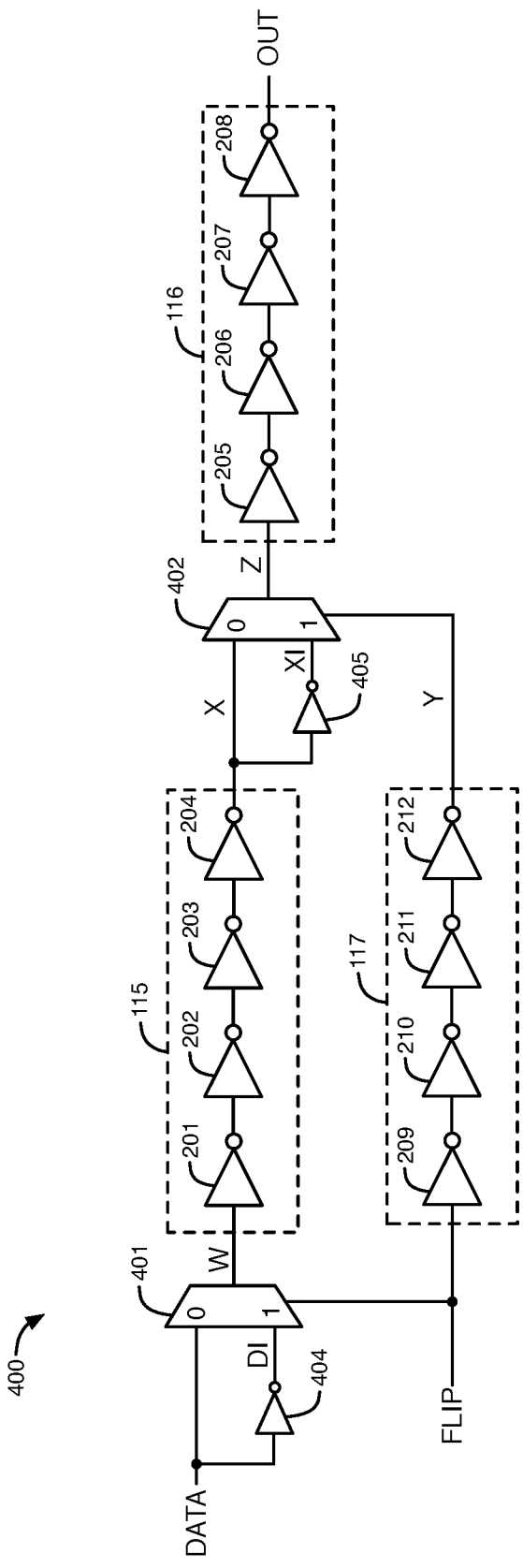
FIG. 4 illustrates another example of circuitry that can reduce the effects of NBTI aging on the pulse width and duty cycle of a signal generated by a series of inverting CMOS logic circuits, according to an embodiment.

FIG. 4 illustrates another example of circuitry that can reduce the effects of NBTI aging in a series of inverting CMOS logic circuits, according to an embodiment. FIG. 4 illustrates circuitry 400 that includes the logic circuits 115-117 disclosed herein with respect to FIGS. 1-2. As with the embodiment of FIG. 2, logic circuits 115, 116, and 117 in circuitry 400 have logic gate circuits 201-204, 205-208, and 209-212, respectively. In some embodiments of FIG. 4, each logic circuit in logic circuits 115-117 is the same type of logic gate circuit having the same circuit architecture.

Circuitry 400 also includes multiplexer circuits 401-402 and CMOS inverter circuits 404-405. In the embodiment of FIG. 4, multiplexer circuit 401 and inverter circuit 404 replace XOR gate circuit 110, and multiplexer circuit 402 and inverter circuit 405 replace XOR gate circuit 111. Circuitry 400 also includes register circuit 120 and XOR gate circuit 112, which generate the FLIP signal as disclosed herein with respect to FIG. 1, although circuits 112 and 120 are not shown in FIG. 4. The FLIP signal is provided to the select input of multiplexer circuit 401, and the Y signal generated by logic circuits 117 is provided to the select input of multiplexer circuit 402. Inverter circuit 404 inverts the DATA signal to generate an inverted data signal DI at the 1 input of multiplexer circuit 401. Inverter circuit 405 inverts the X signal to generate an inverted signal XI at the 1 input of multiplexer circuit 402.

In the embodiment of FIG. 4, when the DATA signal is parked in the same logic state for more than one UI, the FLIP and Y signals are both in logic high states. In response to a logic high state in the FLIP signal, multiplexer circuit 401 provides the inverted data signal DI to the input of logic circuits 115 as signal W. In response to the Y signal being in a logic high state, multiplexer circuit 402 provides the inverted signal XI to the input of logic circuits 116 as signal Z. As a result, the W and Z signals are in opposite logic states when the DATA signal is in the same logic state for more than 1 UI, which causes logic circuits 115 to experience the effects of NBTI aging in the opposite order relative to logic circuits 116, as discussed above with respect to FIGS. 1-3. For example, the even numbered logic circuits 115 and the odd numbered logic circuits 116 experience the effects of NBTI aging when the DATA signal is parked in a logic low state for an extended time. Also, the odd numbered logic circuits 115 and the even numbered logic circuits 116 experience the effects of NBTI aging when the DATA signal is parked in a logic high state for an extended time.

When the DATA signal is toggling, the change in the pulse width of the signal propagating through logic circuits 116 cancels out the change in the pulse width of the signal propagating through logic circuits 115, as discussed above with respect to FIGS. 1-3. The pulse width of signal OUT remains the same or substantially the same after the effects of NBTI aging have occurred in logic circuits 115-116 in circuitry 400 as a result of signal DATA being in the same logic state for an extended time.

When the DATA signal is toggling, the FLIP signal is in a logic low state, which causes multiplexer circuit 401 to provide the logic state of the DATA signal to signal W. In response to the FLIP signal being in a logic low state, the Y signal is also in a logic low state, which causes multiplexer circuit 402 to provide the logic state of the X signal to signal Z. As a result, the logic state of the DATA signal propagates to signal OUT through multiplexer circuit 401, logic circuits 115, multiplexer circuit 402, and logic circuits 116 without any extra logic inversions added by inverter circuits 404-405. When the FLIP signal is in a logic high state, the two extra logic inversions added into the signal path by inverter circuits 404-405 also cause the logic state of the DATA signal to propagate to signal OUT. Thus, the logic state of the DATA signal propagates to signal OUT regardless of whether the DATA signal is toggling or parked in the same logic state for multiple unit intervals. As a result, circuitry 400 does not cause changes to the logic operation of the logic circuitry (not shown) that is coupled to its output at signal OUT.

Figure 5:
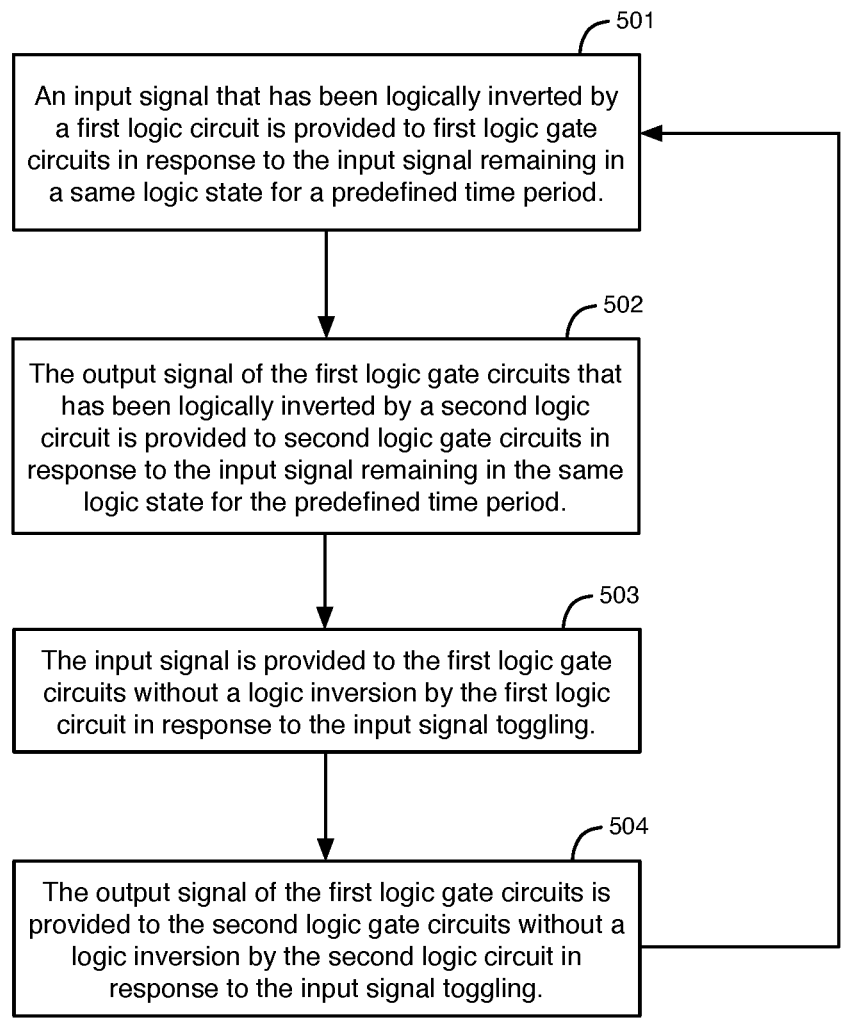
FIG. 5 is a flow chart that illustrates examples of operations that can be performed to reduce the effects of NBTI aging in a series of logic circuits, according to an embodiment.

FIG. 5 is a flow chart that illustrates examples of operations that can be performed for reducing the effects of NBTI aging in a series of logic circuits, according to an embodiment. In operation 501, an input signal that has been logically inverted by a first logic circuit is provided to first logic gate circuits in response to the input signal remaining in a same logic state for a predefined time period. The first logic gate circuits (e.g., logic circuits 115) then generate an output signal based on the inverted input signal. In the embodiment of FIG. 1, the XOR gate circuit 110 inverts the logic state of signal W relative to the logic state of the input DATA signal and provides the inverted signal W to logic circuits 115 in operation 501 in response to the FLIP signal indicating that the DATA signal has been in the same logic state for more than 1 UI. In the embodiment of FIG. 4, multiplexer circuit 401 provides the logic state of the inverted signal DI to logic circuits 115 as signal W in response to the FLIP signal indicating that the DATA signal has been in the same logic state for more than 1 UI in operation 501.

In operation 502, the output signal of the first logic gate circuits that has been logically inverted by a second logic circuit is provided to second logic gate circuits in response to the input signal remaining in the same logic state for the predefined time period. The second logic gate circuits (e.g., logic circuits 116) generate an output signal (e.g., signal OUT) based on the inverted output signal of the first logic gate circuits. In the embodiment of FIG. 1, the XOR gate circuit 111 inverts the logic state of signal Z relative to the logic state of output signal X in operation 502 in response to the Y signal indicating that the DATA signal has been in the same logic state for more than 1 UI. In the embodiment of FIG. 4, multiplexer circuit 402 provides the logic state of the inverted signal XI to logic circuits 116 as signal Z in response to the Y signal indicating that the DATA signal has been in the same logic state for more than 1 UI in operation 502. Logic circuits 117 delay control signal Y relative to control signal FLIP to prevent glitches in signal Y, as discussed above.

In operation 503, the input signal is provided to the first logic gate circuits without a logic inversion by the first logic circuit in response to the input signal toggling. The first logic gate circuits generate an output signal based on the non-inverted input signal. In the embodiment of FIG. 1, XOR gate circuit 110 provides the logic state of the input DATA signal to signal W without an extra logic inversion in operation 503 in response to the FLIP signal indicating that the DATA signal is toggling in each UI. In the embodiment of FIG. 4, multiplexer circuit 401 provides the logic state of the input DATA signal to signal W without an extra logic inversion in operation 503 in response to the FLIP signal being in a logic low state indicating that the DATA signal is toggling.

In operation 504, the output signal of the first logic gate circuits is provided to the second logic gate circuits without a logic inversion by the second logic circuit in response to the input signal toggling. The second logic gate circuits generate an output signal (e.g., signal OUT) based on the non-inverted output signal of the first logic gate circuits. In the embodiment of FIG. 1, XOR gate circuit 111 provides the logic state of signal X to signal Z in operation 504 without an extra logic inversion in response to the Y signal indicating that the DATA signal is toggling in each UI. In the embodiment of FIG. 4, multiplexer circuit 402 provides the logic state of signal X to logic circuits 116 as signal Z without an extra logic inversion in response to the Y signal indicating that the DATA signal is toggling in each UI in operation 504. Operations 501-504 may then be repeated if the input signal remains in the same logic state for more than the predefined time period.

Figure 6:
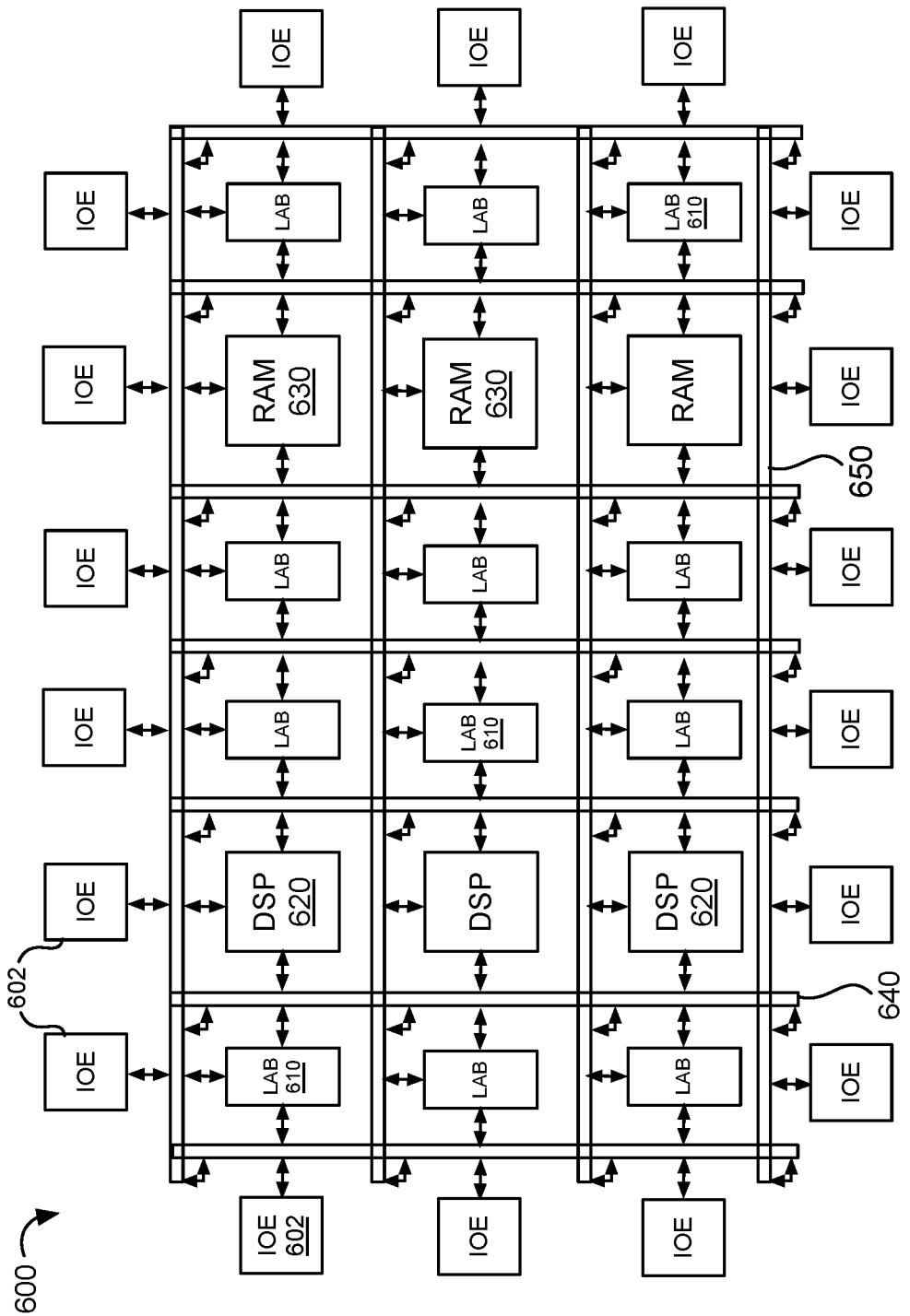
FIG. 6 illustrates an exemplary embodiment of a programmable logic integrated circuit that may contain embodiments disclosed herein, for example, with respect to FIGS. 1-5.

FIG. 6 illustrates an exemplary embodiment of a programmable integrated circuit 600 that may contain embodiments disclosed herein, for example, with respect to FIGS. 1-5. As shown in FIG. 6, the programmable integrated circuit (IC) 600 may include a two-dimensional array of functional blocks, including logic array blocks (LABs) 610 and other functional blocks, such as random access memory (RAM) blocks 630 and digital signal processing (DSP) blocks 620. Functional blocks such as LABs 610 may include smaller programmable regions (e.g., logic elements, configurable logic blocks, or adaptive logic modules) that receive input signals and perform custom functions on the input signals to produce output signals.

In addition, programmable IC 600 may have input/output elements (IOEs) 602 for driving signals off of programmable IC 600 and for receiving signals from other devices. Input/output elements 602 may include parallel input/output circuitry, serial data transceiver circuitry, differential receiver and transmitter circuitry, or other circuitry used to connect one integrated circuit to another integrated circuit. As shown, input/output elements 602 may be located around the periphery of the chip. If desired, the programmable IC 600 may have input/output elements 602 arranged in different ways. For example, input/output elements 602 may form one or more columns, rows, or islands of input/output elements that may be located anywhere on the programmable IC 600. Circuitry 150 of FIG. 1 or circuitry 400 of FIG. 4 may be located in one or more LABs 610, DSP blocks 620, RAM blocks 630, and/or IOEs 602 on IC 600.

The programmable IC 600 may also include programmable interconnect circuitry in the form of vertical routing channels 640 (i.e., interconnects formed along a vertical axis of programmable IC 600) and horizontal routing channels 650 (i.e., interconnects formed along a horizontal axis of programmable IC 600), each routing channel including at least one track to route at least one wire.

Note that other routing topologies, besides the topology of the interconnect circuitry depicted in FIG. 6, may be used. For example, the routing topology may include wires that travel diagonally or that travel horizontally and vertically along different parts of their extent as well as wires that are perpendicular to the device plane in the case of three dimensional integrated circuits. The driver of a wire may be located at a different point than one end of a wire.

Furthermore, it should be understood that embodiments disclosed herein with respect to FIGS. 1-5 may be implemented in any integrated circuit. If desired, the functional blocks of such an integrated circuit may be arranged in more levels or layers in which multiple functional blocks are interconnected to form still larger blocks. Other device arrangements may use functional blocks that are not arranged in rows and columns.

Programmable IC 600 may contain programmable memory elements. Memory elements may be loaded with configuration data using input/output elements (IOEs) 602. Once loaded, the memory elements each provide a corresponding static control signal that controls the operation of an associated functional block (e.g., LABs 610, DSP blocks 620, RAM blocks 630, or input/output elements 602).

In a typical scenario, the outputs of the loaded memory elements are applied to the gates of metal-oxide-semiconductor field-effect transistors (MOSFETs) in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The programmable memory elements may be organized in a configuration memory array consisting of rows and columns. A data register that spans across all columns and an address register that spans across all rows may receive configuration data. The configuration data may be shifted onto the data register. When the appropriate address register is asserted, the data register writes the configuration data to the configuration memory bits of the row that was designated by the address register.

In certain embodiments, programmable IC 600 may include configuration memory that is organized in sectors, whereby a sector may include the configuration RAM bits that specify the functions and/or interconnections of the subcomponents and wires in or crossing that sector. Each sector may include separate data and address registers.

The programmable IC of FIG. 6 is merely one example of an IC that can include embodiments disclosed herein. The embodiments disclosed herein may be incorporated into any suitable integrated circuit. For example, the embodiments disclosed herein may be incorporated into numerous types of devices such as processor integrated circuits, central processing units, memory integrated circuits, graphics processing unit integrated circuits, application specific standard products (ASSPs), application specific integrated circuits (ASICs), and programmable logic integrated circuits. Examples of programmable logic integrated circuits include programmable arrays logic (PALs), programmable logic arrays (PLAs), field programmable logic arrays (FPLAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The integrated circuits disclosed in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application. The integrated circuits can be used to perform a variety of different logic functions.

The following examples pertain to further embodiments. Example 1 is logic circuitry comprising: a first logic circuit that inverts a first output signal relative to an input signal only in response to a first control signal having a first state that indicates that the input signal has remained in a same logic state for at least a predefined period of time; second logic circuits coupled in series, wherein the second logic circuits generate a second output signal in response to the first output signal; a third logic circuit that inverts a third output signal relative to the second output signal only in response to the first control signal having the first state; and fourth logic circuits coupled in series, wherein the fourth logic circuits generate a fourth output signal in response to the third output signal.

In Example 2, the logic circuitry of Example 1 can optionally further include wherein the first logic circuit buffers the first output signal without inverting the first output signal relative to the input signal in response to the first control signal having a second state that indicates that the input signal is toggling, and wherein the third logic circuit buffers the third output signal without inverting the third output signal relative to the second output signal in response to the first control signal having the second state.

In Example 3, the logic circuitry of any one of Examples 1-2 can optionally further include: fifth logic circuits coupled in series, wherein the fifth logic circuits generate a second control signal by delaying the first control signal, wherein a delay of the fifth logic circuits is substantially the same as a delay of the second logic circuits, and wherein the second control signal is provided to an input of the third logic circuit.

In Example 4, the logic circuitry of Example 3 can optionally further include: a register circuit that delays the input signal by a delay to generate a delayed signal, wherein the predefined period of time equals the delay of the register circuit, and wherein the delay of the register circuit is at least one unit interval of a bit in the input signal; and a sixth logic circuit coupled to the first logic circuit and to an input of the fifth logic circuits, wherein the sixth logic circuit generates the first control signal in response to the input signal and the delayed signal.

In Example 5, the logic circuitry of any one of Examples 1-4 can optionally further include wherein the first logic circuit is a first XOR gate circuit, and wherein the third logic circuit is a second XOR gate circuit.

In Example 6, the logic circuitry of any one of Examples 1-4 can optionally further include wherein the first logic circuit comprises a first inverter circuit and a first multiplexer circuit, wherein the first inverter circuit is coupled to a first input of the first multiplexer circuit, wherein the input signal is provided to a second input of the first multiplexer circuit and to the first inverter circuit, and wherein the first control signal controls selection of the first output signal generated by the first multiplexer circuit.

In Example 7, the logic circuitry of Example 6 can optionally further include wherein the third logic circuit comprises a second inverter circuit and a second multiplexer circuit, wherein the second inverter circuit is coupled to a first input of the second multiplexer circuit, and wherein the second output signal is provided to a second input of the second multiplexer circuit and to an input of the second inverter circuit.

In Example 8, the logic circuitry of Example 7 can optionally further include: fifth logic circuits coupled in series, wherein the fifth logic circuits generate a second control signal by delaying the first control signal, and wherein the second control signal controls selection of the third output signal generated by the second multiplexer circuit.

In Example 9, the logic circuitry of Example 8 can optionally further include wherein each of the second logic circuits is an inverting CMOS logic gate circuit, wherein each of the fourth logic circuits is an inverting CMOS logic gate circuit, and wherein each of the fifth logic circuits is an inverting CMOS logic gate circuit.

Example 10 is an integrated circuit comprising: a first logic circuit that inverts a first output signal relative to an input signal in response to a first control signal being in a first logic state indicating that the input signal has been in a same logic state for at least a predefined time period, and wherein the first logic circuit does not invert the first output signal in response to the first control signal being in a second logic state indicating that the input signal is toggling; first logic gate circuits that generate a second output signal based on the first output signal; a second logic circuit that inverts a third output signal relative to the second output signal in response to the first control signal being in the first logic state, wherein the second logic circuit does not invert the third output signal in response to the first control signal being in the second logic state; and second logic gate circuits that generate a fourth output signal based on the third output signal.

In Example 11, the integrated circuit of Example 10 can optionally further include: third logic gate circuits that generate a second control signal by delaying the first control signal, wherein a delay of the third logic gate circuits is substantially the same as a delay of the first logic gate circuits, and wherein the second control signal is provided to an input of the second logic circuit.

In Example 12, the integrated circuit of Example 11 can optionally further include: a register circuit that delays the input signal by a delay to generate a delayed signal, wherein the predefined time period equals the delay of the register circuit, and wherein the delay of the register circuit is at least one unit interval of a bit in the input signal; and a third logic circuit coupled to the first logic circuit and to the third logic gate circuits, wherein the third logic circuit generates the first control signal in response to the input signal and the delayed signal.

In Example 13, the integrated circuit of any one of Examples 10-12 can optionally further include, wherein the first logic circuit is a first XOR gate circuit, and wherein the second logic circuit is a second XOR gate circuit.

In Example 14, the integrated circuit of any one of Examples 10-12 can optionally further include, wherein the first logic circuit comprises a first inverter circuit and a first multiplexer circuit, wherein the second logic circuit comprises a second inverter circuit and a second multiplexer circuit, and wherein the first control signal controls selection of the first and second multiplexer circuits.

In Example 15, the integrated circuit of Example 14 can optionally further include, wherein the first inverter circuit is coupled to a first input of the first multiplexer circuit, wherein the input signal is provided to a second input of the first multiplexer circuit and to the first inverter circuit, wherein the second inverter circuit is coupled to a first input of the second multiplexer circuit, and wherein the second output signal is provided to a second input of the second multiplexer circuit and to an input of the second inverter circuit.

In Example 16, the integrated circuit of any one of Examples 14-15 can optionally further include: third logic gate circuits that generate a second control signal by delaying the first control signal, wherein the second control signal is provided to a select input of the second multiplexer circuit.

Example 17 is a method for reducing effects of aging in logic circuitry, the method comprising: providing an input signal that has been logically inverted by a first logic circuit to first logic gate circuits in response to the input signal remaining in a same logic state for a predefined time period; providing an output signal of the first logic gate circuits that has been logically inverted by a second logic circuit to second logic gate circuits in response to the input signal remaining in the same logic state for the predefined time period; providing the input signal to the first logic gate circuits without a logic inversion by the first logic circuit in response to the input signal toggling; and providing the output signal of the first logic gate circuits to the second logic gate circuits without a logic inversion by the second logic circuit in response to the input signal toggling.

In Example 18, the method of Example 17 can optionally further include: generating a first control signal by delaying a second control signal using third logic gate circuits, wherein a delay of the third logic gate circuits is substantially the same as a delay of the first logic gate circuits, wherein the first control signal controls whether a logically inverted or non-inverted version of the output signal is provided to the second logic gate circuits by the second logic circuit, and wherein the second control signal controls whether a logically inverted or non-inverted version of the input signal is provided to the first logic gate circuits by the first logic circuit.

In Example 19, the method of any one of Examples 17-18 can optionally further include: generating the output signal of the first logic gate circuits based on the input signal; and generating an output signal of the second logic gate circuits based on the output signal of the first logic gate circuits.

In Example 20, the method of any one of Examples 17-19 can optionally further include, wherein the first logic circuit is a first XOR gate circuit, and wherein the second logic circuit is a second XOR gate circuit.

The foregoing description of the exemplary embodiments of the present invention has been presented for the purpose of illustration. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. Logic circuitry comprising:
    a first logic circuit that inverts a first output signal relative to an input signal only in response to a first control signal having a first state that indicates that the input signal has remained in a same logic state for at least a predefined period of time;
    second logic circuits coupled in series, wherein the second logic circuits generate a second output signal in response to the first output signal;
    a third logic circuit that inverts a third output signal relative to the second output signal only in response to the first control signal having the first state; and
    fourth logic circuits coupled in series, wherein the fourth logic circuits generate a fourth output signal in response to the third output signal.

2. The logic circuitry of claim 1, wherein the first logic circuit buffers the first output signal without inverting the first output signal relative to the input signal in response to the first control signal having a second state that indicates that the input signal is toggling, and
    wherein the third logic circuit buffers the third output signal without inverting the third output signal relative to the second output signal in response to the first control signal having the second state.

3. The logic circuitry of claim 1 further comprising:
    fifth logic circuits coupled in series, wherein the fifth logic circuits generate a second control signal by delaying the first control signal, wherein a delay of the fifth logic circuits is substantially the same as a delay of the second logic circuits, and wherein the second control signal is provided to an input of the third logic circuit.

4. The logic circuitry of claim 3 further comprising:
    a register circuit that inverts and delays the input signal by a delay to generate an inverted delayed signal, wherein the predefined period of time equals the delay of the register circuit, and wherein the delay of the register circuit is at least one unit interval of a bit in the input signal; and
    a sixth logic circuit coupled to the first logic circuit and to an input of the fifth logic circuits, wherein the sixth logic circuit generates the first control signal in response to the input signal and the inverted delayed signal.

5. The logic circuitry of claim 1, wherein the first logic circuit is a first XOR gate circuit, and wherein the third logic circuit is a second XOR gate circuit.

6. The logic circuitry of claim 1, wherein the first logic circuit comprises a first inverter circuit and a first multiplexer circuit, wherein the first inverter circuit is coupled to a first input of the first multiplexer circuit, wherein the input signal is provided to a second input of the first multiplexer circuit and to the first inverter circuit, and wherein the first control signal controls selection of the first output signal generated by the first multiplexer circuit.

7. The logic circuitry of claim 6, wherein the third logic circuit comprises a second inverter circuit and a second multiplexer circuit, wherein the second inverter circuit is coupled to a first input of the second multiplexer circuit, and wherein the second output signal is provided to a second input of the second multiplexer circuit and to an input of the second inverter circuit.

8. The logic circuitry of claim 7 further comprising:
    fifth logic circuits coupled in series, wherein the fifth logic circuits generate a second control signal by delaying the first control signal, and wherein the second control signal controls selection of the third output signal generated by the second multiplexer circuit.

9. The logic circuitry of claim 8, wherein each of the second logic circuits is an inverting CMOS logic gate circuit, wherein each of the fourth logic circuits is an inverting CMOS logic gate circuit, and wherein each of the fifth logic circuits is an inverting CMOS logic gate circuit.

10. An integrated circuit comprising:
a first logic circuit that inverts a first output signal relative to an input signal in response to a first control signal being in a first logic state indicating that the input signal has been in a same logic state for at least a predefined time period, and wherein the first logic circuit does not invert the first output signal in response to the first control signal being in a second logic state indicating that the input signal is toggling;
first logic gate circuits that generate a second output signal based on the first output signal;
a second logic circuit that inverts a third output signal relative to the second output signal in response to the first control signal being in the first logic state, wherein the second logic circuit does not invert the third output signal in response to the first control signal being in the second logic state; and
second logic gate circuits that generate a fourth output signal based on the third output signal.

11. The integrated circuit of claim 10 further comprising:
third logic gate circuits that generate a second control signal by delaying the first control signal, wherein a delay of the third logic gate circuits is substantially the same as a delay of the first logic gate circuits, and wherein the second control signal is provided to an input of the second logic circuit.

12. The integrated circuit of claim 11 further comprising:
a register circuit that inverts and delays the input signal by a delay to generate an inverted delayed signal, wherein the predefined time period equals the delay of the register circuit, and wherein the delay of the register circuit is at least one unit interval of a bit in the input signal; and
a third logic circuit coupled to the first logic circuit and to the third logic gate circuits, wherein the third logic circuit generates the first control signal in response to the input signal and the inverted delayed signal.

13. The integrated circuit of claim 10, wherein the first logic circuit is a first XOR gate circuit, and wherein the second logic circuit is a second XOR gate circuit.

14. The integrated circuit of claim 10, wherein the first logic circuit comprises a first inverter circuit and a first multiplexer circuit, wherein the second logic circuit comprises a second inverter circuit and a second multiplexer circuit, and wherein the first control signal controls selection of the first and second multiplexer circuits.

15. The integrated circuit of claim 14, wherein the first inverter circuit is coupled to a first input of the first multiplexer circuit, wherein the input signal is provided to a second input of the first multiplexer circuit and to the first inverter circuit, wherein the second inverter circuit is coupled to a first input of the second multiplexer circuit, and wherein the second output signal is provided to a second input of the second multiplexer circuit and to the second inverter circuit.

16. The integrated circuit of claim 15 further comprising:
third logic gate circuits that generate a second control signal by delaying the first control signal, wherein the second control signal is provided to a select input of the second multiplexer circuit.

17. A method for reducing effects of aging in logic circuitry, the method comprising:
providing an input signal that has been logically inverted by a first logic circuit to first logic gate circuits in response to the input signal remaining in a same logic state for a predefined time period;
providing an output signal of the first logic gate circuits that has been logically inverted by a second logic circuit to second logic gate circuits in response to the input signal remaining in the same logic state for the predefined time period;
providing the input signal to the first logic gate circuits without a logic inversion by the first logic circuit in response to the input signal toggling; and
providing the output signal of the first logic gate circuits to the second logic gate circuits without a logic inversion by the second logic circuit in response to the input signal toggling.

18. The method of claim 17 further comprising:
generating a first control signal by delaying a second control signal using third logic gate circuits, wherein a delay of the third logic gate circuits is substantially the same as a delay of the first logic gate circuits, wherein the first control signal controls whether a logically inverted or non-inverted version of the output signal is provided to the second logic gate circuits by the second logic circuit, and wherein the second control signal controls whether a logically inverted or non-inverted version of the input signal is provided to the first logic gate circuits by the first logic circuit.

19. The method of claim 17 further comprising:
generating the output signal of the first logic gate circuits based on the input signal; and
generating an output signal of the second logic gate circuits based on the output signal of the first logic gate circuits.

20. The method of claim 17, wherein the first logic circuit is a first XOR gate circuit, and wherein the second logic circuit is a second XOR gate circuit.

* * * * *